(12) United States Patent
Chang et al.

(10) Patent No.: US 6,498,759 B2
(45) Date of Patent: Dec. 24, 2002

(54) SYSTEM FOR AUTOMATIC GENERATION OF SUITABLE VOLTAGE SOURCE ON MOTHERBOARD

(75) Inventors: Nai-Shung Chang, Taipei Hsien (TW); Ching-Fu Chuang, Taipei (TW); Hsiu-Wen Ho, Hsinchuang (TW)

(73) Assignee: VIA Technologies, Inc., Taipei Hsien (TW)

( * ) Notice: Subject to any disclaimer, the term of this patent is extended or adjusted under 35 U.S.C. 154(b) by 20 days.

(21) Appl. No.: 09/752,119

(22) Filed: Dec. 29, 2000

(65) Prior Publication Data

US 2002/0003740 A1 Jan. 10, 2002

Related U.S. Application Data

(60) Provisional application No. 60/174,426, filed on Jan. 4, 2000, and provisional application No. 60/177,906, filed on Jan. 25, 2000.

(30) Foreign Application Priority Data

Jul. 5, 2000 (TW) .......................................... 89113313

(51) Int. Cl.⁷ ................................................ G11C 7/00
(52) U.S. Cl. ........................................ 365/226; 365/63
(58) Field of Search ............................ 365/226, 63, 52; 710/102; 711/167, 172; 307/64; 395/750.01, 183.18; 323/281, 267

(56) References Cited

U.S. PATENT DOCUMENTS

| | | | |
|---|---|---|---|
| 5,578,916 A | * 11/1996 | Muterspaugh | 323/267 |
| 5,781,780 A | * 7/1998 | Walsh et al. | 395/750.01 |
| 5,862,320 A | * 1/1999 | Nelsen et al. | 395/183.18 |
| 5,953,243 A | * 9/1999 | Capp, Jr. et al. | 365/52 |
| 5,982,655 A | * 11/1999 | Doyle | 365/63 |
| 5,983,297 A | * 11/1999 | Noble et al. | 710/102 |
| 6,016,280 A | * 1/2000 | Maesako et al. | 365/226 |
| 6,177,785 B1 | * 1/2001 | Lee | 323/281 |
| 6,260,127 B1 | * 7/2001 | Olarig et al. | 711/167 |
| 6,285,091 B1 | * 9/2001 | Chan et al. | 307/641 |
| 6,298,426 B1 | * 10/2001 | Ajanovic | 711/172 |

* cited by examiner

Primary Examiner—David Nelms
Assistant Examiner—Thinh T Nguyen
(74) Attorney, Agent, or Firm—J. C. Patents

(57) ABSTRACT

A system can produce a suitable voltage for powering the memory modules plugged into the memory module slots of a motherboard. A power-good signal is issued when the motherboard is powered up. A power safety device on the motherboard then issues a 2.5V to the memory module slot. If DDR DRAM type of memory modules are not detected after a while, the power safety device will turn off the 2,5V supply and provide a 3.3V, which is suitable for SDRAM type memory modules. This invention avoids sending a 3.3V to DDR DRAM modules, thereby burning the memory chip. The presence of DDR DRAM modules can be detected by a general-purpose purpose input/output port through accessing the recorded data in the EEPROM of the memory module. Alternatively, memory module type can be determined by sending out a low-current pulse signal to the memory module slot. Hence, a suitable voltage source is automatically provided to power the memory modules in the slots.

21 Claims, 5 Drawing Sheets

SYSTEM FOR AUTOMATIC GENERATION OF SUITABLE VOLTAGE SOURCE ON MOTHERBOARD

CROSS-REFERENCE TO RELATED APPLICATION

This application claims the priority benefit of provisional application serial No. 60/174,426, filed Jan. 4, 2000; 60/177,906 filed Jan. 25, 2000 and Taiwan application Ser. No. 89113313, filed Jul. 5, 2000.

BACKGROUND OF THE INVENTION

1. Field of Invention

The present invention relates to a type of motherboard. More particularly, the present invention relates to a motherboard system capable of producing a suitable voltage source to power synchronous dynamic random access memory (SDRAM) and double-data-rate dynamic random access memory (DDR DRAM).

2. Description of Related Art

At present, most personal computers use synchronous dynamic access memory (SDRAM) for program and data storage. Since SDRAM responds to the rising edge of a system clock, operations are triggered by the rising edge of a clock cycle only. Following recent advances in semiconductor technology, another type of memory known as double-data-rate DRAM (DDR DRAM) is introduced into the market. DDR DRAM responds to both the rising and the falling edge of a system clock, and hence the operating speed of memory is almost doubled.

The operating modes of SDRAM and DDR DRAM are different in many aspects, including; (1) SDRAM uses normal clock pulse signals while DDR DRAM uses differential clock signals; (2) SDRAM uses $V_{DD}$=3.3V while DDR DRAM uses $V_{DD}$=2.5V and $V_{DDQ}$=2.5V; (3) SDRAM does not require a reference voltage, but DDR DRAM requires a reference voltage whose value is about ½ $V_{DDQ}$; (4) SDRAM connects to a data bus that operates on CMOS logic while DDR DRAM connects to a data bus that operates on series-stub-terminated logic 2 (STTL_2); (5) there is no need for the SDRAM connected data bus connected to use a terminated voltage ($V_{TT}$), but DDR DRAM connected to data bus must use a terminated voltage ($V_{TT}$) to absorb reflected waves; and (6) there is no need for the SDRAM connected to data bus to use a pull-up resistor, but the DDR DRAM connected to data bus must use a pull-up resistor. However, a DDR DRAM is able to operate at a speed roughly double that of the SDRAM.

Due to the aforementioned differences between SDRAM and DDR DRAM, particularly to the power requirements, inappropriate provision of power supply can pin to severe problems. For example, if DDR DRAM modules are plugged into the slots on a motherboard, the memory modules may be burnt if the power supply provides a 3.3 V. Alternatively, if SDRAM modules are plugged into the slots on a motherboard, the memory modules may not operate normally if the power supply only provides a 2.5V voltage source.

SUMMARY OF THE INVENTION

Accordingly, one object of the present invention is to provide a system on a motherboard capable of automatically providing a 2.5V voltage source to power DDR DRAM modules and a 3.3V voltage source to power SDRAM. Consequently, consumers do not have to worry about burning the memory modules or memory malfunction due to a difference in operating voltages between the two types of memory modules.

To achieve these and other advantages and in accordance with the purpose of the invention, as embodied arid broadly described herein, the invention provides an automatic voltage generation system on a motherboard. The system includes a general-purpose input/output port, a memory module slot and a power safety device. The memory module slot is used for accommodating a memory module. The power safety device is coupled to the general-purpose input/output port and the memory module slot. According to the output from the general-purpose input/output port of a chipset, the power source pin of the power safety device outputs a 3.3V when SDRAM is plugged into the memory module slot. Alternatively, the power source pin of the power safety device outputs a 2.5V when DDR DRAM is plugged into the memory module slot.

The motherboard further includes a central processing unit (CPU) and the memory module further includes an electrical erasable programmable read-only-memory (EEPROM) for recording related data indicating the memory module When the system is boot up, the CPU is able to read the related data recorded in the EEPROM through a chipset and recognize the type of memory module plugged into the slots and control the output from the general-purpose input/output port. Therefore, the power safety device is able to determine whether to supply a 3.3V or a 2.5V to the voltage source pin automatically.

The power safety device further includes a first flip-flop, a second flip-flop, a first field effect transistor and a second field effect transistor. The first flip-flop has a first input terminal, a second input terminal and a positive phase output terminal. The first input terminal of the first flip-flop receives output from the general-purpose input/output port and the second input terminal of the first flip-flop receives signal from a power-good signal supplier The second flip-flop has a first input terminal, a second input terminal and a negative phase output terminal. The first input terminal of the second flip-flop receives output from the general-purpose input/output port and the second input terminal of the second flip-flop receives signal from a power-good signal supplier. The first field effect transistor has a gate electrode, a first source/drain electrode and a second source/drain electrode. The gate electrode of the first field effect transistor is coupled to the positive phase output terminal of the first flip-flop and a +12V voltage source via a first resistor. The first source/drain electrode of the first field effect transistor is coupled to a 3.3V voltage source and the second source/drain is electrode of the first field effect transistor is coupled to the voltage source pin. The second field effect transistor has a gate electrode, a first source/drain electrode and a second source/drain electrode, The gate electrode of the second field effect transistor is coupled to the negative phase output terminal of the second flip-flop and a +12V voltage source via a second resistor. The first source/drain electrode of the second field effect transistor is coupled to a 2.5V voltage source and the second source/drain electrode of the second field effect transistor is coupled to the voltage source pin.

On starting the computer system, the power-good signal causes the second source/drain electrode of the second field effect transistor to output 2.5V to the voltage source pin. If the memory module slot contains a SDRAM module, output from the general-purpose input/output port causes the second source/drain electrode of the first field effect transistor to output 3.3V to the voltage source pin. On the other hand, if the memory module slot contains a DDR DRAM module, the 2.5V output to the voltage source pin is maintained. In brief, the power safety device is able to output 3.3V or 2.5V to the voltage source pin automatically according to the type of memory module plugged into the memory slot.

The power safety device can also provide a low-current pulse to the reference voltage source pin of the memory module slot. By checking if any fluctuation in the low-current pulse exceeds a pre-defined range, a current one of SDRAM or DDR DRAM being plugged into the memory module slot can be determined. According to the type of memory modules plugged into the slots, a 3.3V or a 2.5V is automatically put on the voltage source pin.

It is to be understood that both the foregoing general description and the following detailed description are exemplary, and are intended to provide further explanation of the invention as claimed.

BRIEF DESCRIPTION OF TEE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIG. 1 is a block diagram showing the method of setting up an appropriate voltage source on a motherboard through signaling via the GPIO pin of a control chipset according to a first preferred embodiment of this invention, FIG. 2 is a circuit diagram of the power safety device shown in FIG. 1FIG.

DESCRIPTION OF THE PREFERRED EMBODIMENTS

Figure 1:
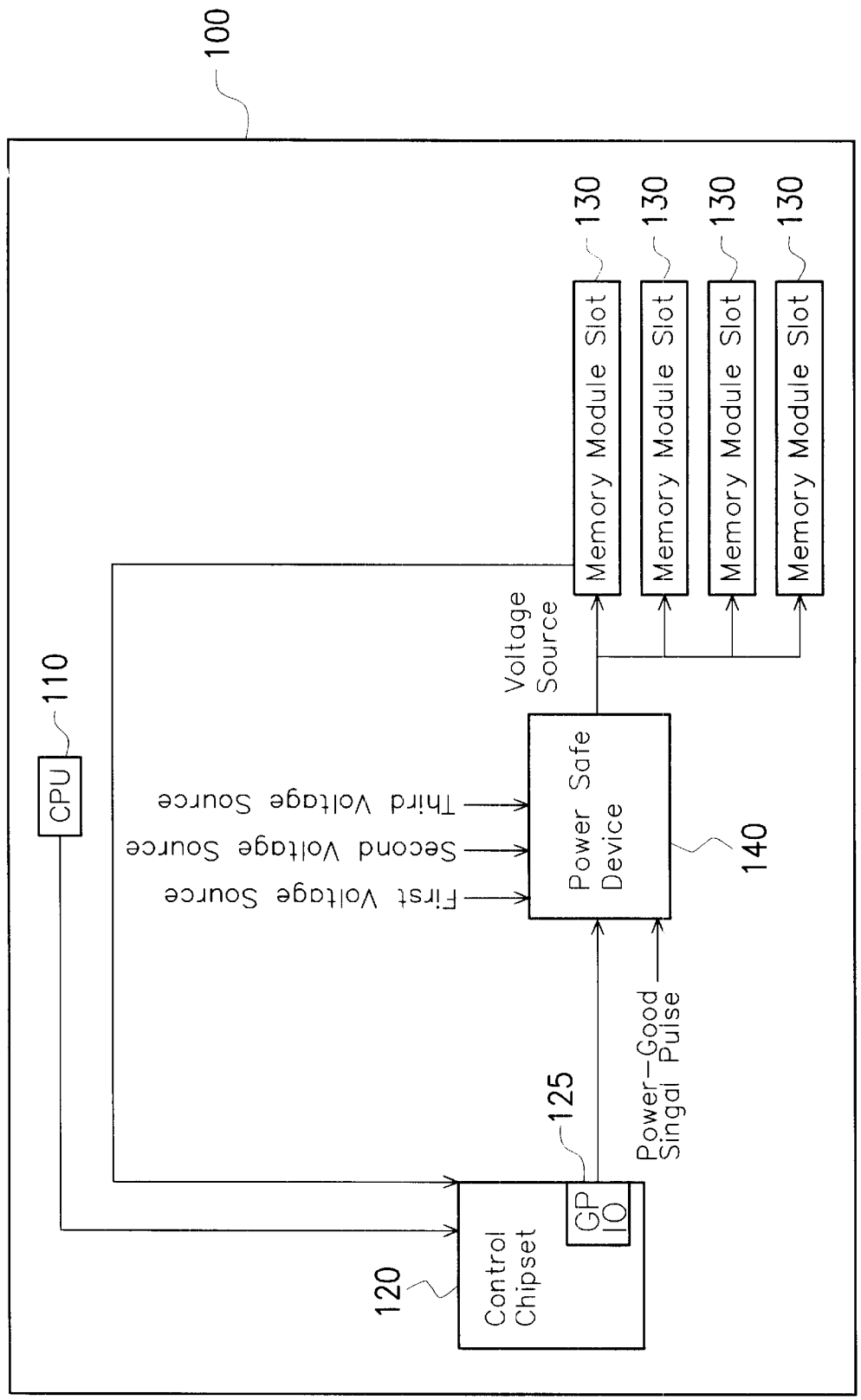

Reference will now be made in detail to the present preferred embodiments of the invention, examples of which are illustrated in the accompanying drawings wherever possible, the same reference numbers are used in the drawings and the description to refer to the same or like parts.

FIG. 1 is a block diagram showing the method of setting up an appropriate voltage source on a motherboard through signaling via the GPIO pin of a control chipset according to a first preferred embodiment of this invention. As shown in FIG. 1, the motherboard 100 includes a central processing unit (CPU) 110, a control chipset 120, memory module slots 130 and a power safety device 140. Control chipset 120 has a general-purpose input/output (GPIO) port 125 coupled to CPU 110. The CPU 110 is able to read the state value from GPIO port 125 of control chipset 120. Memory module slots 130 are used for accommodating memory modules. Each memory module slot 130 has a voltage source pin ($V_{DIMM}$) for powering a memory module. Power safety device 140 is coupled to GPIO port 125 and memory module slots 130. According to output from GPIO port 125, a 2.5V is put on the voltage source pin when DDR DRAM modules are plugged into memory module slots 130. Alternatively, a 3.3V is put on the voltage source pin when SDRAM modules are plugged into memory module slots 130.

The memory modules inside memory module slots 130 further includes an electrical erasable programmable read-only-memory (EEPROM) that can be used to record memory module related data. CPU 110 is able to determine the type of memory module used on the motherboard according to data stored in the EEPROM. Once the type of memory module is determined, output from GPIO port 125 is controlled so that a 2.5V or a 3.3V is put to the voltage source pin of power safety device 140 accordingly. Anyone familiar with the technology may notice that any other ports having output port characteristics may be used besides GPIO port 125.

Figure 2:
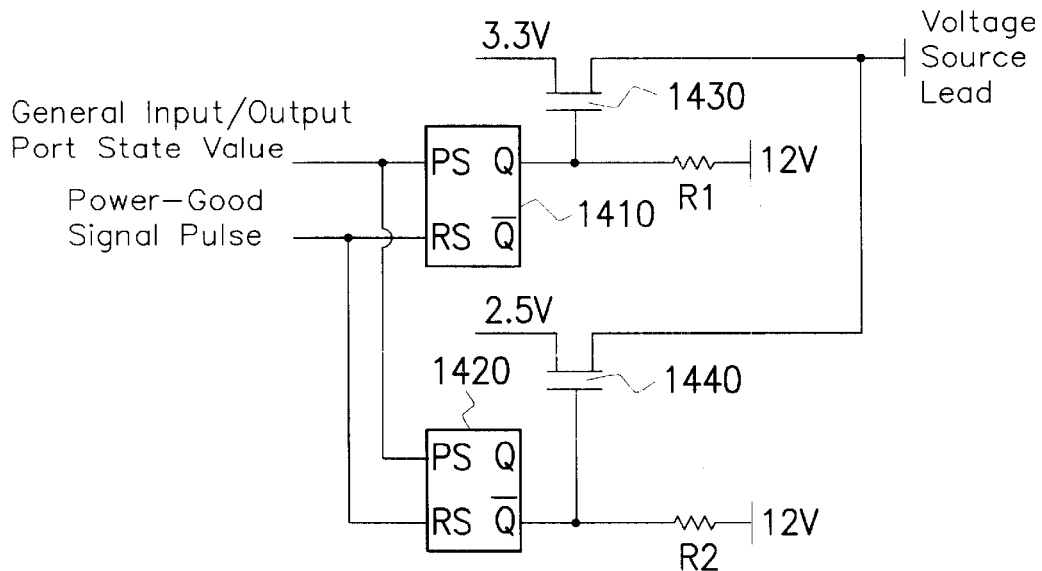

FIG. 2 is a circuit diagram of the power safety device shown in FIG. 1. As shown in FIG. 2, power safety device 140 of this invention includes a first flip-flop 1410, a second flip-flop 1420, a first field effect transistor 1430 and a second field effect transistor 1440. First flip-flop 1410 has a first input terminal (PS), a second input terminal (RS) and a positive phase output terminal (Q), First input terminal (PS) of first flip-flop 1410 receives output from general-purpose input/output port 125 and second input terminal (RS) of first flip-flop 1410 receives signal from the power-good signal supplier on motherboard 100. Second flip-flop 1420 has a first input terminal (PS), a second input terminal (RS) and a negative phase output terminal ($\overline{Q}$). First input terminal (PS) of second flip-flop 1420 receives output from general-purpose input/output port 125 and second input terminal (RS) of second flip-flop 1420 receives signal from the power-good signal supplier. First field effect transistor 1430 has a gate electrode, a first source/drain electrode and a second source/drain electrode. The gate electrode of the first field effect transistor 1430 is coupled to the positive phase output terminal of first flip-flop 1410 and a +12V voltage source is applied there via a first resistor R1. The first source/drain electrode of first field effect transistor 1430 is coupled to a 3.3V voltage source and the second source/drain electrode of the first field effect transistor 1430 is coupled to the voltage source pin. Second field effect transistor 1440 has a gate electrode, a first source/drain electrode and a second source/drain electrode. The gate electrode of the second field effect transistor 1440 is coupled to the negative phase output terminal of second flip-flop 1420 and a +12V voltage source via a resistor R2. The first source/drain electrode of second field effect transistor 1440 is coupled to a 2.5V voltage source and the second source/drain electrode of second field effect transistor 1440 is coupled to the voltage source pin.

In the foregoing resistors R1 and R2, the resistance for the resistors R1 and R2 are at the typical quantities, such as a few hundred ohms. However, the actual quantities of the resistors RI and R2 are design choice, which allows the desired voltage to serve as the input voltage source.

On starting the computer system, the power-good signal causes the second source/drain electrode of second field effect transistor 1440 to output 2.5V to the voltage source pin. If the memory module slots contain memory modules such as SDRAM module, output from general-purpose input/output port 125 causes the second source/drain electrode of first field effect transistor 1430 to output 3.3V to the voltage source pin. In other words, a 2.5V is put on the voltage source pin automatically on starting the computer system However, on detecting the presence of SDRAM modules in the memory slots, a 3.3V is put on the voltage source pin. Hence, the burning of memory module due to the supply of an inappropriate source voltage is prevented.

Figure 3:
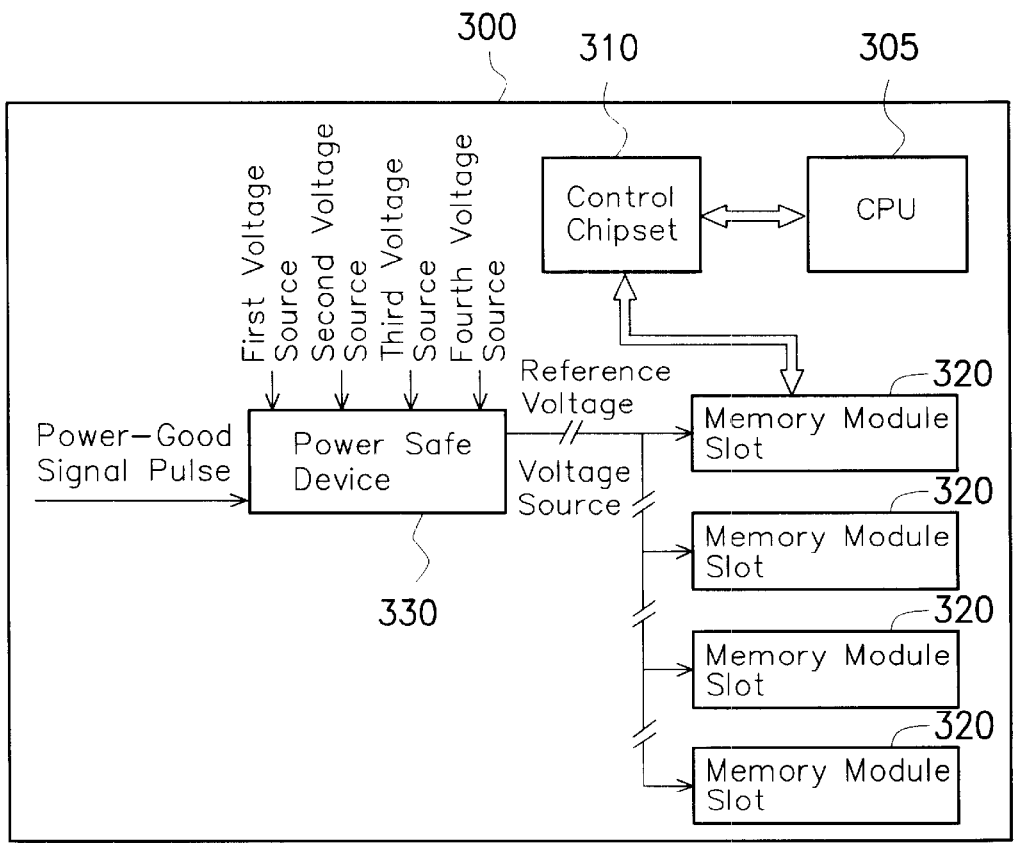
FIG. 3 is a block diagram showing the method of setting up an appropriate voltage source on a motherboard through detecting the fluctuation of a low-current pulse according to a second preferred embodiment of this invention.

FIG. 3 is a block diagram showing the method of setting up an appropriate voltage source on a motherboard through detecting the fluctuation of a low-current pulse according to a second preferred embodiment of this invention, As shown in FIG. 3, the motherboard 300 includes a central control unit 305, a control chipset 310, memory module slots 320 and a power safety device 330 Control chipset 310 is coupled to central control unit 305. Since both central control unit 305 and control chipset 310 are not related to the action provided by the system of this invention, detail descriptions of their operations are not made here. Memory module slots 320 are used for accommodating memory modules. Memory module slots 320 include a voltage source pin and a reference voltage pin $V_{ref}$ for providing necessary power to the memory modules. Power safety device 330 is coupled to memory module slots 320. According to the power-good signal provided by motherboard 300, a low current pulse signal with a range of about 5 $\mu$A–10 $\mu$A is transmitted to the reference voltage pin of memory module slots 320. Based on the type of memory modules plugged into memory module slots 320, a 2.5V or a 3.3V is put on the voltage source pin of power safety device 330. When SDRAM modules are plugged into memory module slot 320, a 3.3V is set up on the voltage source pin. On the other hand, when DDR DRAM modules are plugged into memory module slots 320, a 2.5V is supplied on the voltage source pin.

Figure 4:
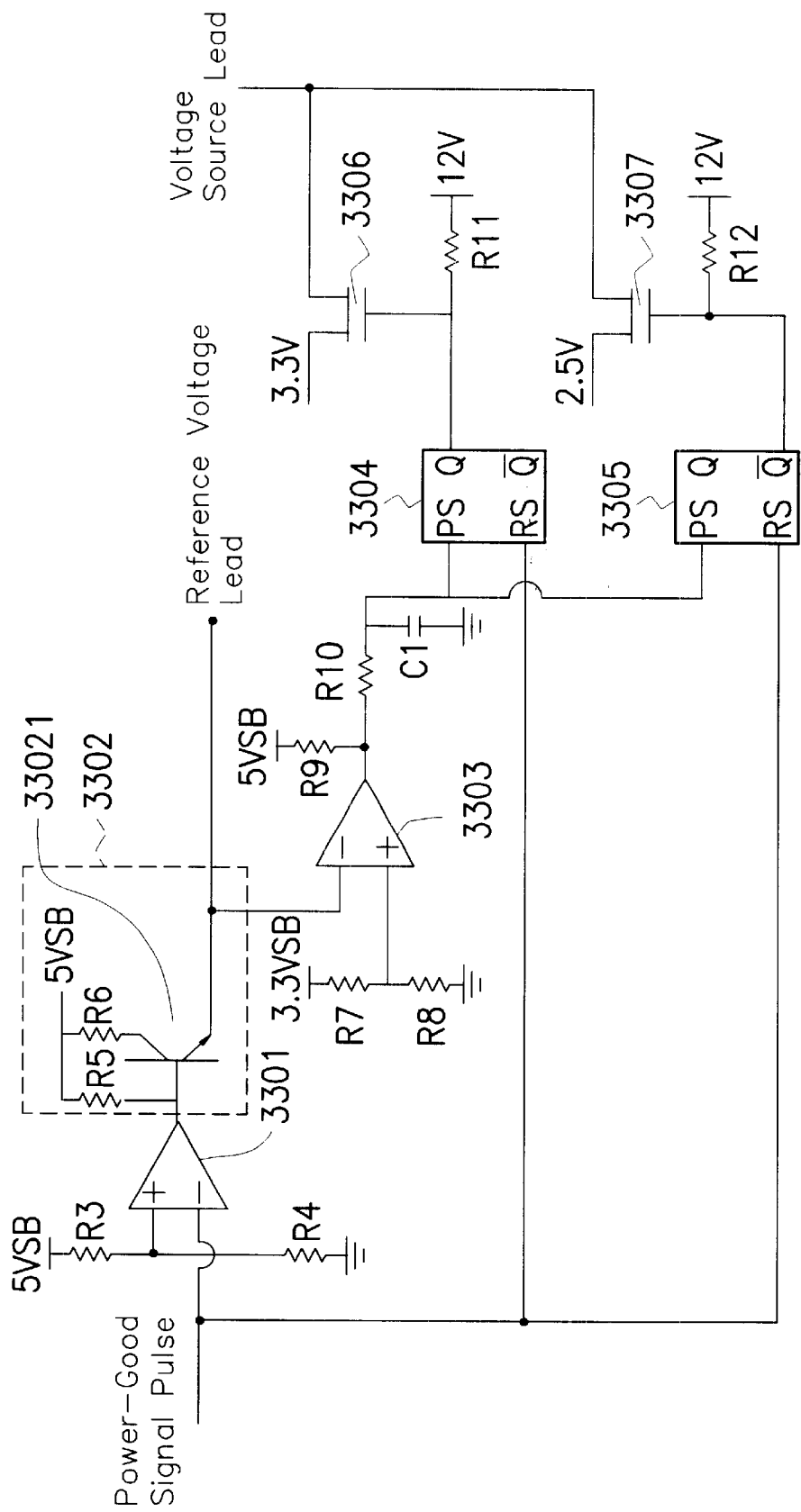
FIG. 4 is a circuit diagram of the power safety device shown in FIG. 3.

FIG. 4 is a circuit diagram of the power safety device shown in FIG. 3. As shown in FIG. 4, power safety device 330 includes an inversion amplifier 3301, a low-current pulse generator 3302, a second inversion amplifier 3303, a first flop-flop 3304, a second flip-flop 3305, a first field effect transistor 3306 and a second field effect transistor 3307. First inversion amplifier 3301 has a positive phase input terminal (+), a negative phase input terminal (−) and an output terminal, The positive phase input terminal of first inversion amplifier 3301 is coupled to a third voltage source (5VSB, standby 5V power source) via a first resistor R3 and coupled to ground via another resistor R4 for obtaining a reference voltage The negative phase input terminal is coupled to the power-good signal pulse supplier. Low-current pulse generator 3302 has an input terminal and an output terminal. The input terminal of low-current pulse generator 3302 is coupled to the output terminal of first inversion amplifier 3301 for generating a low-current pulse signal with a range about 5$\mu$A–10 $\mu$A and transferring the low-current pulse signal to the reference voltage pin Similarly, second inversion amplifier 3303 has a positive phase input terminal, a negative input terminal and an output terminal The negative phase input terminal of the second inversion amplifier 303 is coupled to the output terminal of low-current pulse generator 3302. First flip-flop 3304 has a first input terminal (PS), a second input terminal (RS) and a positive phase output terminal (Q). The first input terminal of first flip-flop 3304 is coupled to the output terminal of second inversion amplifier 3303. The second input terminal of first flip-flop 3304 is coupled to the power-good signal supplier. Second flip-flop 3305 has a first input terminal (PS), a second input terminal (RS) and a negative phase output terminal ($\overline{Q}$). The first input terminal of second flip-flop 3305 is coupled to the output terminal of second inversion amplifier 3303. The second input terminal of second flip-flop 3305 is coupled to the power-good signal supplier. First field effect transistor 3306 has a gate electrode, a first source/drain electrode and a second source/drain electrode. The gate electrode of the first field effect transistor 3306 is coupled to the positive phase output terminal of first flip-flop 3304 and coupled to a +12V voltage source via a second resistor R1. The first source/drain electrode of the first field effect transistor 3306 is coupled to a 3.3V voltage source. The second source/drain electrode of the first field effect transistor 3306 is coupled to the voltage source pin. Second field effect transistor 3307 has a gate electrode, a first source/drain electrode and a second source/drain electrode. The gate electrode of the second field effect transistor 3307 is coupled to the negative phase output terminal of second flip-flop 3305 and coupled to a +12V voltage source via a third resistor R12. The first source/drain electrode of the second field effect transistor 3307 is coupled to a 2.5V voltage source. The second source/drain electrode of the second field effect transistor 3307 is coupled to the voltage source pin.

When motherboard 300 (also see FIG. 3) issues a power-good signal pulse, the power-good signal pulse is compared with the reference voltage at the positive phase input terminal of first inversion amplifier 3301. After comparison, a negative phase power-good signal pulse is transmitted to low-current pulse generator 3302. The reference voltage is obtained by voltage division of accurate standby power source 5VSB. The low-current pulse generator 3302 comprises of a PNP transistor 33021 and resistors RS and R6. The negative phase power-good signal pulse is able to render the PNP transistor 33021 conductive during high potential. Hence, a 5 $\mu$A~10 $\mu$A low-current pulse is transmitted to the reference voltage pin of memory module slot and the negative phase input terminal of the second inversion amplifier 3303. If SDRAM modules are plugged into memory module slots 302, the low-current pulse signal has little changes because SDRAM modules do not have a reference voltage pin. After inversion amplification through the second inversion amplifier 3303, the signal is input to the first input terminal of first flip-flop 3304 and second flip-flop 3305. The positive phase output terminal of the first flop-flop 3304 then outputs a high potential leading to the conduction of the first field effect transistor 3306. A 3.3V is output to the voltage source pin from the second source/drain electrode of the first field effect transistor 3306. The negative phase output terminal of the second flip-flop 3305 outputs a low potential causing an "OFF" of the second field effect transistor 3307. If DDR DRAM modules are plugged into the memory module slots 302, low-current pulse signal is consumed away by the load on the DDR DRAM modules. When variation of low-current pulse signal is greater than a preset value, input voltage at the negative phase input terminal of second inversion amplifier 3303 becomes smaller than the reference voltage value, Hence, the output of the second inversion amplifier 3303 remains at a low potential. The positive output terminal of the first flip-flop 3304 outputs a low potential leading to the closing of the first field transistor 3306 The negative output terminal of the second flip-flop 3305 outputs a high potential causing the conduction of the second field effect transistor 3307. Hence, a 2.5V is output to the voltage source pin from the second source/drain electrode of the second field effect transistor 3307. Therefore, the type of memory modules plugged into slots 320 can be determined by detecting any fluctuation of low-current pulse signal so that motherboard 300 can provide an appropriate voltage to memory module slots 320.

In the foregoing resistors of R3–R12 of FIG. 4, the resistance for each resistor is a usual design in the circuit, so as to associate with the function circuits, such as the amplifiers 3301, 3303, the flip-flop's 3304, 3305 and field effect transistors 3306, 3307, wherein the field effect transistors can be, for example, a N-type MOS transistor.

Figure 5:
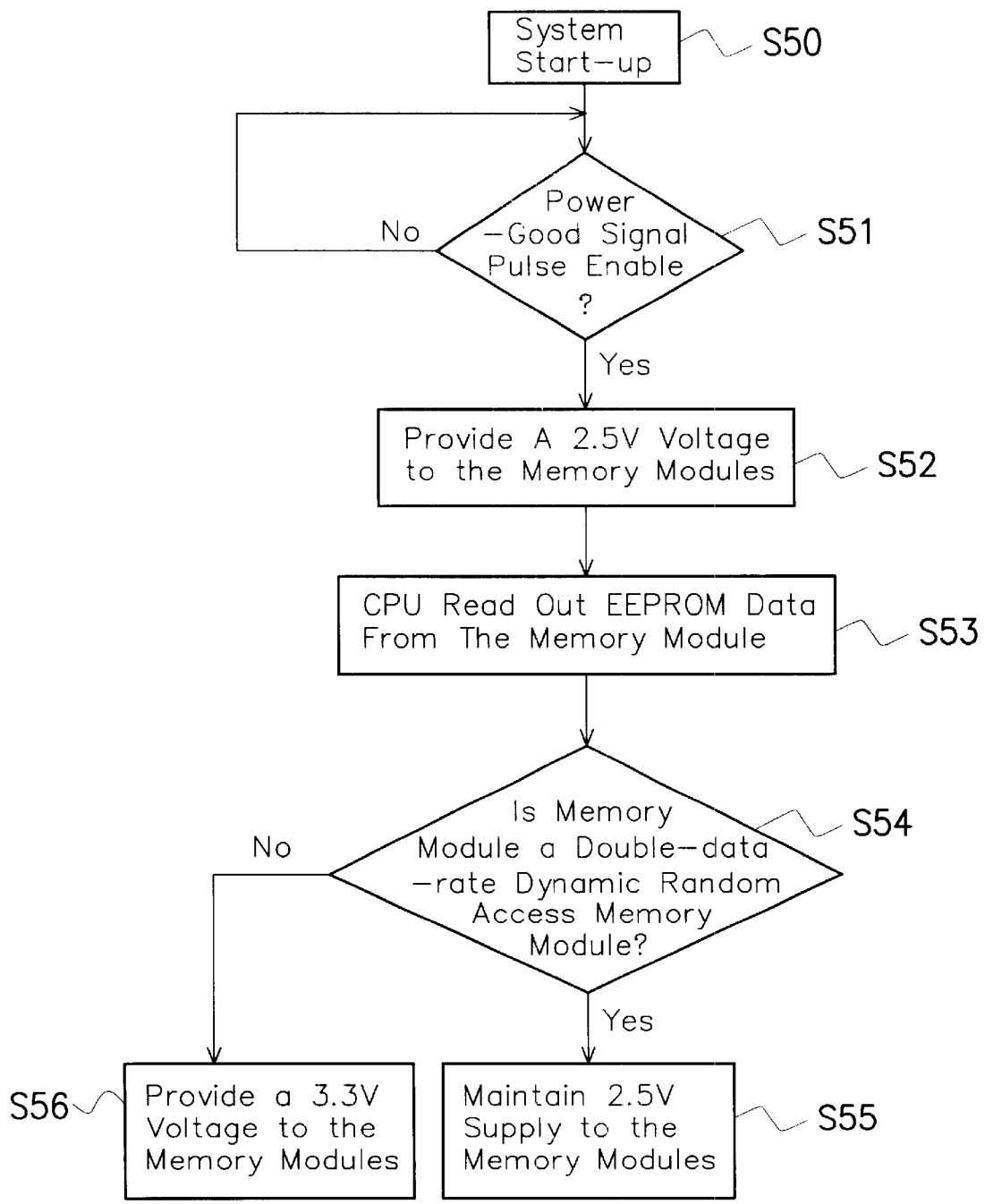
FIG. 5 is a flow chart showing the steps for controlling source output voltage using the GPIO pin of control chipset according to the first preferred embodiment of this invention.

FIG. 5 is a flow chain showing the steps for controlling source output voltage using the GPIO pin of control chipset according to the first preferred embodiment of this invention. This invention provides a method for outputting a first voltage or a second voltage to the voltage source pin in the memory module slots of a motherboard. A memory module can be plugged into each memory module slot. If DDR DRAM modules are plugged into the slots, the second voltage is put on the voltage source pin On the other hand, if SDRAM modules are plugged into the slots, the first voltage is put on the voltage source pin. As shown in FIG. 5, the method of this invention includes steps S50~S56. On starting up a computer system, a power-good signal pulse is provided in step S50. The power-good signal pulse is checked to determine if the power-good signal pulse contains an enable signal in step S51. If the power-good signal pulse contains an enable signal, the second voltage is put on the voltage source pin in step S52. Otherwise, control returns to step S51 where power-good signal pulse is checked again. The CPU reads out the values on the EEPROM of the memory modules in step S53. The type of memory modules inserted to the memory module slot is determined in step S54 If DDR DRAM modules are detected, the second voltage is put on the voltage source pin in step S55. However, if SDRAM modules are detected, the first voltage is put on the voltage source pin in step S56.

Step S53 further includes a series of sub-steps. When modules in the slots are SDRAM modules, the value read out by CPU 100 through a chipset from the EEPROM of memory module according to the state value of input/output port 125 will indicate SDRAM. Hence, the first voltage is output to the voltage source pin. On the other hand, when modules connected to the slots are DDR DRAM modules, the value read out by CPU 100 from the EEPROM of memory module, according to the state value of input/output port 125, indicates DDR DRAM. Hence, the second voltage output to the voltage source pin is maintained. The first voltage can be 3.3V and the second voltage can be 2.5V, for example.

Figure 6:
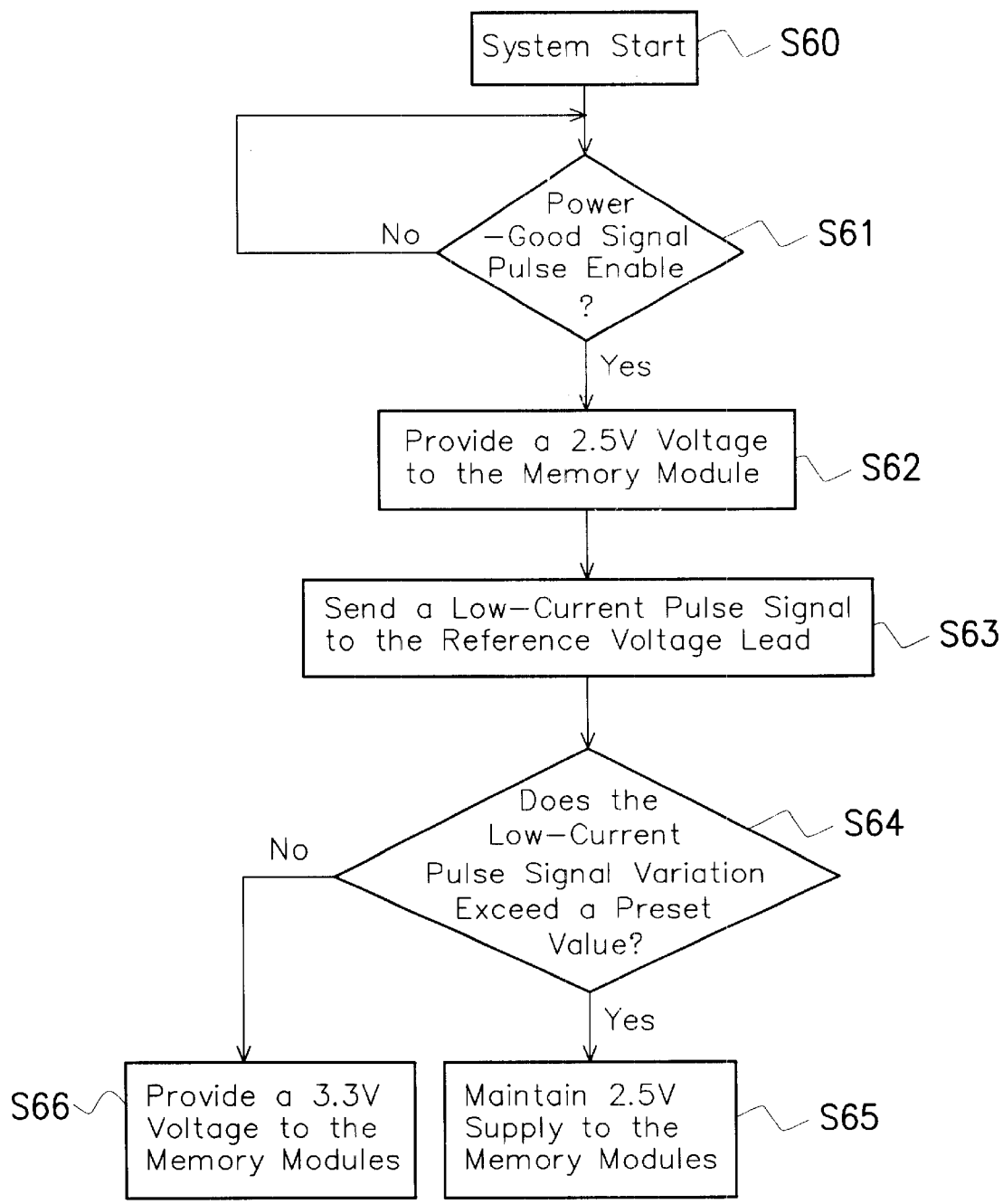
FIG. 6 is a flow chart showing the steps for controlling source output voltage through detecting any fluctuation in low-current pulse according to the second preferred embodiment of this invention.

FIG. 6 is a flow chart showing the steps for controlling source output voltage through detecting any fluctuation in low-current pulse according to the second preferred embodiment of this invention. This invention also provides a second method for outputting a first voltage or a second voltage to the voltage source pin in the memory module slots of a motherboard. Each memory module slot 320 includes a reference voltage pin and a plug-in memory module. If SDRAM modules are plugged into the slots, the first voltage is put on the voltage source pin. On the other hand, if DDR DRAM modules are plugged into the slots, the second voltage is put on the voltage source pin. As shown in FIG. 6, the method of this invention includes steps S60~S66. On starting up a computer system, a power-good signal pulse is provided in step S60. The power-good signal pulse is checked to determine if the power-good signal pulse contains an enable signal in step S61. If the power-good signal pulse contains an enable signal, the second voltage is put on the voltage source pin in step S62. Otherwise, control returns to step S61 where power-good signal pulse is checked again. A low-current pulse signal is output to the reference voltage pin in step S63. Variation of the low-current pulse signal is checked to determine if the signal exceeds a preset value in step S64, If the low-current pulse signal exceeds the preset value, the second voltage on the voltage source pin is maintained in step S65. However, if the low-current pulse signal is still below the preset value, the first voltage is output to the voltage source pin in step S66. The first voltage can be 3.3V and the second voltage can be 2.5V, for example.

Since SDRAM modules do not have a reference voltage pin, the output of low-current pulse signal to the reference voltage pin in step S63 has no effect on the variation of low-current pulse signal. Hence, a 3.3V is output to the voltage source pin of the SDRAM modules. On the other hand, DDR DRAM modules have reference voltage pins and the memory has an internal load that may lower the low-currernt pulse signal, causing the variation level greater than the preset value. Hence, a 2.5V output to the voltage source pin of the DDR DRAM modules is maintained.

In summary, a system on a motherboard capable of producing a suitable voltage source to operate a particular type of memory modules is provided. According to whether SDRAM modules or DDR DRAM modules are used, a suitable voltage that meets the demands of the plug-in module type is automatically generated. Consequently, users do not have to worry about burning the memory modules when memory modules of a particular type are plugged into the slots on the motherboard.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A motherboard capable of automatically providing a suitable voltage source, comprising;
    an output port,
    a memory module slot for plugging a memory module, wherein the memory module slot has a voltage source pin for providing power to the memory module; and
    a power safety device coupled to the output port and the memory module slot, wherein the power safety device, according to an output from the output port, supplies a first voltage to the voltage source pin when the memory module is a first type memory module and supplies a second voltage to the voltage source pin when the memory module is a second type memory module.

2. The motherboard of claim 1, wherein the motherboard farther includes a central processing unit (CPU) and the memory module further includes an electrical erasable programmable read-only-memory (EEPROM) for recording related data of the memory module, whereby the CPU can known a type of the memory module currently plugged into the memory module slot through a chipset according to the data recorded in the EEPROM, and hence control the output from the output port so that the power safety device can supply either the first voltage or the second voltage.

3. The motherboard of claim 2, wherein the power safety device further includes;
    a first flip-flop having a first input terminal, a second input terminal and a positive phase output terminal, of which the first flip-flop the first input terminal receives the output from the output port, the second input terminal receives a power-good signal pulse from the motherboard;
    a second flip-flop having a first input terminal, a second input terminal and a negative phase output terminal, of which the second flip-flop the first input terminal receives the output from the output port, the second input terminal receives the power-good signal pulse from the motherboard;

a first field effect transistor having a gate electrode, a first source/drain electrode and a second source/drain electrode, of which the first field effect transistor the gate electrode is coupled to the positive phase output terminal of the first flip-flop and a third voltage source via a first resistor, the first source/drain electrode is coupled to the first voltage source, and the second source/drain electrode is coupled to the voltage source pin; and a second field effect transistor having a gate electrode, a first source/drain electrode and a second source/drain electrode, of which the second field effect transistor ha the gate electrode is coupled to the negative phase output terminal of the second flip-flop and the third voltage source via a second resistor, the first source/drain electrode is coupled to the second voltage source and the second source/drain electrode coupled to the voltage source pin;

wherein the power-good signal pulse triggers the second source/drain output terminal of the second field effect transistor to export the second voltage to the voltage source pin, and if the first type memory module is plugged into the memory module slot, the output from the output port triggers the second source/drain output terminal of the first field effect transistor to export the first voltage to the voltage source pin.

4. The motherboard of claim 3, wherein the first type memory module includes a synchronous dynamic random access memory module and the second type memory module includes a double-data-rate dynamic random access memory module.

5. The motherboard of claim 3, wherein the first voltage is 3.3V and the second voltage is 2.5V.

6. The motherboard of claim 3, wherein the third voltage is 12V.

7. The motherboard of claim 2, wherein the motherboard further includes a control chipset that includes the output port.

8. A motherboard capable of automatically producing a suitable voltage source, comprising:

a memory module slot used for plugging a memory module, wherein the memory module slot has a voltage source pin for providing power to the memory module; and a power safety device coupled to the memory module slot used for outputting a first voltage or a second voltage to the voltage source pin according to a power-good signal pulse from the motherboard and a type of the currently plugged memory module.

9. The motherboard of claim 8, wherein the memory module slot further includes a reference voltage pin for receiving a low-current pulse signal output from the power safety device according to the power-good signal pulse so that a type of the currently plugged memory module in the memory module slot can be detected.

10. The motherboard of claim 9, wherein the power safety device includes:

a first inversion amplifier having a positive phase input terminal, a negative phase input terminal, and an output terminal, of which the first inversion amplifier the positive phase input terminal is coupled to a third voltage source via a first resistor and the negative phase input terminal is coupled to the power-good signal pulse;

a low-current pulse generator having an input terminal and an output terminal, of which the low-current pulse generator the input terminal is coupled to the output terminal of the first inversion amplifier for producing the low-current pulse signal that is also exported to the reference voltage pin;

a second inversion amplifier having a positive phase input terminal, a negative phase input terminal, and an output terminal, of which the second inversion amplifier the negative phase input terminal is coupled to the output terminal of the low-current pulse generator;

a first flip-flop having a first input terminal, a second input terminal and a positive phase output terminal, of which the first flip-flop the first input terminal is coupled to the output terminal of the second inversion amplifier and the second input terminal is coupled to the power-good signal pulse;

a second flip-flop having a first input terminal, a second input terminal and a negative phase output terminal, of which the second flip-flop the first input terminal is coupled to the output terminal of the second inversion amplifier and the second input terminal is coupled to the power-good signal pulse;

a first field effect transistor having a gate electrode, a first source/drain electrode and a second source/drain electrode, of which the first field effect transistor the gate electrode is coupled to the positive phase output terminal of the first flip-flop and a fourth voltage source via a second resistor, the first source/drain electrode is coupled to the first voltage source and the second source/drain electrode is coupled to the voltage source pin; and a second field effect transistor having a gate electrode, a first source/drain electrode and a second source/drain electrode, of which the second field effect transistor the gate electrode is coupled to the negative phase output terminal of the second flip-flop and a fourth voltage source via a third resistor, the first source/drain electrode is coupled to the second voltage source and the second source/drain electrode is coupled to the voltage source pin;

wherein the low-current pulse signal triggers the outputting of the first voltage from the second source/drain electrode of the first field effect transistor to the voltage source pin if a synchronous dynamic random access memory module is plugged into the memory module slot, if a double-data-rate dynamic random access memory module is plugged into the memory module slot so that the second voltage is output from the second source/drain electrode of the second field effect transistor to the voltage source pin.

11. The motherboard of claim 10, wherein the first voltage is 3.3V and the second voltage is 2.5V.

12. The motherboard of claim 10, wherein the third voltage is a 5V standby voltage source and the fourth voltage is a 12V voltage source.

13. The motherboard of claim 10, wherein the low-current pulse generator comprises of a transistor and a plurality of resistors.

14. A method for automatically supplying one selected from a group consisting of a first voltage and a second voltage to a voltage source pin in a memory module slot on a motherboard so that the voltage source pin receives the first voltage when a first type memory module is plugged into the memory module slot while the voltage source pin receives the second voltage when a second type memory module is plugged into the memory module, the method comprising:

providing a power-good signal pulse;

providing the voltage source pin with the second voltage if the power-good signal pulse enables;

determining a type of a memory module plugged into the memory module slot; and providing the voltage source pin with the first voltage if the first type memory module is plugged into the memory module slot.

15. The method of claim 14, wherein the motherboard further includes a central processing unit and an output port so that the step of providing the voltage source pin with the first voltage is carried out by the central processing unit through controlling a state value at the output port according to the type of the memory module.

16. The method of claim 15, wherein the memory module further includes an electrical erasable programmable read-only-memory (EEPROM) for recording related data indicating the memory module, and the step of determining the type of memory module includes that the central processing unit reads the related data of the memory module recorded in the EEPROM through a chipset.

17. The method of claim 16, wherein the first type memory module includes synchronous dynamic random access memory module and the second type memory module includes double-data-rate dynamic random access memory module.

18. The method of claim 16, wherein the first voltage is 3.3V and the second voltage is 2.5V.

19. A method for automatically supplying one selected from a group consisting of a first voltage and a second voltage to a voltage source pin in a memory module slot on a motherboard, so that the voltage source pin receives the first voltage when a first type memory module is plugged into the memory module slot while the voltage source pin receives the second voltage when a second type memory module is plugged into the memory module, the memory module also has a reference voltage pin, the method comprising;

providing a power-good signal pulse;

providing the voltage source pin with the second voltage and outputting a low-current pulse signal to the reference voltage pin if the power-good signal pulse enables and providing the voltage source pin with the first voltage when the low-current pulse signal on the reference voltage pin is smaller than a preset value.

20. The method of claim 19, wherein the first type memory module includes synchronous dynamic random access memory module and the second type memory module includes double-data-rate dynamic random access memory module.

21. The method of claim 19, wherein the first voltage is 3.3V and the second voltage is 2.5V.

* * * * *